_US005777385A_

United States Patent [19]

Wu

[11] Patent Number: 5,777,385
[45] Date of Patent: Jul. 7, 1998

[54] CERAMIC BALL GRID ARRAY (CBGA) PACKAGE STRUCTURE HAVING A HEAT SPREADER FOR INTEGRATED-CIRCUIT CHIPS

[75] Inventor: Leon Li-Heng Wu, Austin, Tex.

[73] Assignee: International Business Machines Corporation, Armonk, N.Y.

[21] Appl. No.: 811,459

[22] Filed: Mar. 3, 1997

[51] Int. Cl.[6] .................... H01L 23/06; H01L 23/10; H01L 23/34; H01L 23/48
[52] U.S. Cl. ............... 257/712; 257/705; 257/706; 257/783; 257/778; 257/779
[58] Field of Search .................... 257/712, 703, 257/705, 706, 777, 783, 736, 778, 779, 717, 720

[56] References Cited

U.S. PATENT DOCUMENTS

| | | | |
|---|---|---|---|
| 4,149,310 | 4/1979 | Nippert | 29/630 |
| 4,561,040 | 12/1985 | Eastman et al. | 361/385 |
| 5,291,064 | 3/1994 | Kurokawa | 257/706 |
| 5,378,924 | 1/1995 | Liang | 257/675 |
| 5,525,834 | 6/1996 | Fischer et al. | 257/691 |
| 5,583,073 | 12/1996 | Lin et al. | 437/183 |
| 5,614,766 | 3/1997 | Takasu et al. | 257/777 |

FOREIGN PATENT DOCUMENTS

| 5041408 | 2/1993 | Japan | 257/783 |
|---|---|---|---|

*Primary Examiner*—Mahshid D. Saadat
*Assistant Examiner*—Jhihan B. Clark
*Attorney, Agent, or Firm*—Anthony V.S. England; Antony P. Ng; Andrew J. Dillon

[57] ABSTRACT

An improved package structure for integrated-circuit chips is disclosed. In accordance with a preferred embodiment of the present invention, the integrated-circuit packaged structure comprises a wiring substrate, an integrated-circuit chip, and a heat spreader. The integrated-circuit chip has a first surface and a second surface, wherein the first surface is electrically and mechanically connected to the wiring substrate via a first set of solder joints. The heat spreader is connected to the second surface of the integrated-circuit chip via a second set of solder joints. The heat spreader includes an adhesion-promotion layer on top of a silicon layer, such that heat generated from the integrated-circuit chip can be efficiently transmitted to and subsequently dissipated by the heat spreader.

5 Claims, 4 Drawing Sheets

5,777,385

1

CERAMIC BALL GRID ARRAY (CBGA) PACKAGE STRUCTURE HAVING A HEAT SPREADER FOR INTEGRATED-CIRCUIT CHIPS

BACKGROUND OF THE INVENTION

1. Technical Field

The present invention relates to a package structure for integrated-circuit chips in general and, in particular, to a heat-dissipating package structure for integrated-circuit chips. Still more particularly, the present invention relates to a heat-dissipating package structure having an efficient heat spreader for integrated-circuit chips.

2. Description of the Prior Art

In recent years, integrated-circuit (IC) chips have had a remarkable increase in device density and power consumption, mainly attributed to the decrease in transistor geometry and the increase in clock speed. In order to meet the package requirements for these high-density IC chips without adding to delay times, a packaging method known as flip-chip connection is becoming a preferred choice for packaging high-density IC chips. Under the flip-chip connection method, IC chips are connected to a wiring substrate by utilizing a number of small $Pb_{95}Sn_5$ solder bumps. These small solder bumps enable a higher-density package to be achieved because the package area is substantially the same as that of the chip size and, also, high-speed signal propagation can be maintained due to the relatively short connection distances. Furthermore, because the whole chip surface may be utilized as a connection area, the number of external terminal pins on the package can also be increased.

For conventional wire-bonded IC chips, the backside of the IC chips is contacted directly, or through a solid member, to a heat sink. The heat generated from the IC chip will be dissipated first through conduction and then through convection to the atmosphere. Under the flip-chip connection method, the solder bumps between the IC chip and the wiring substrate are only about 100 µm to 200 µm in diameter; thus the heat dissipation characteristics of this type of package structure is not very satisfactory for high-power IC chips. As a result, it has been found that it is quite difficult to utilize the flip-chip type package structure for packaging IC chips that generate a large amount of heat. Consequently, it would be desirable to provide an improved heat-dissipating package structure having a heat spreader for packaging high-density, high-power IC chips.

SUMMARY OF THE INVENTION

In view of the foregoing, it is therefore an object of the present invention to provide an improved package structure for integrated-circuit chips.

It is another object of the present invention to provide an improved heat-dissipating package structure for integrated-circuit chips.

It is yet another object of the present invention to provide a heat-dissipating package structure having a highly efficient heat spreader for integrated-circuit chips.

In accordance with a preferred embodiment of the present invention, an integrated-circuit package structure comprises a wiring substrate, an integrated-circuit chip, and a heat spreader. The integrated-circuit chip has a first surface and a second surface, wherein the first surface is electrically and mechanically connected to the wiring substrate via a first set of solder joints. The heat spreader is connected to the second surface of the integrated-circuit chip via a second set of solder joints. The heat spreader includes an adhesion-promotion layer on top of a silicon layer, such that heat generated from the integrated-circuit chip can be efficiently transmitted to and subsequently dissipated by the heat spreader.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

The present invention may be applicable to any ceramic ball grid array (CBGA) package structure for high-density high-power integrated-circuit (IC) chips. For the purpose of illustration, a preferred embodiment of the present invention, as described below, is implemented on a flip-chip type CBGA single chip module.

Figure 1:
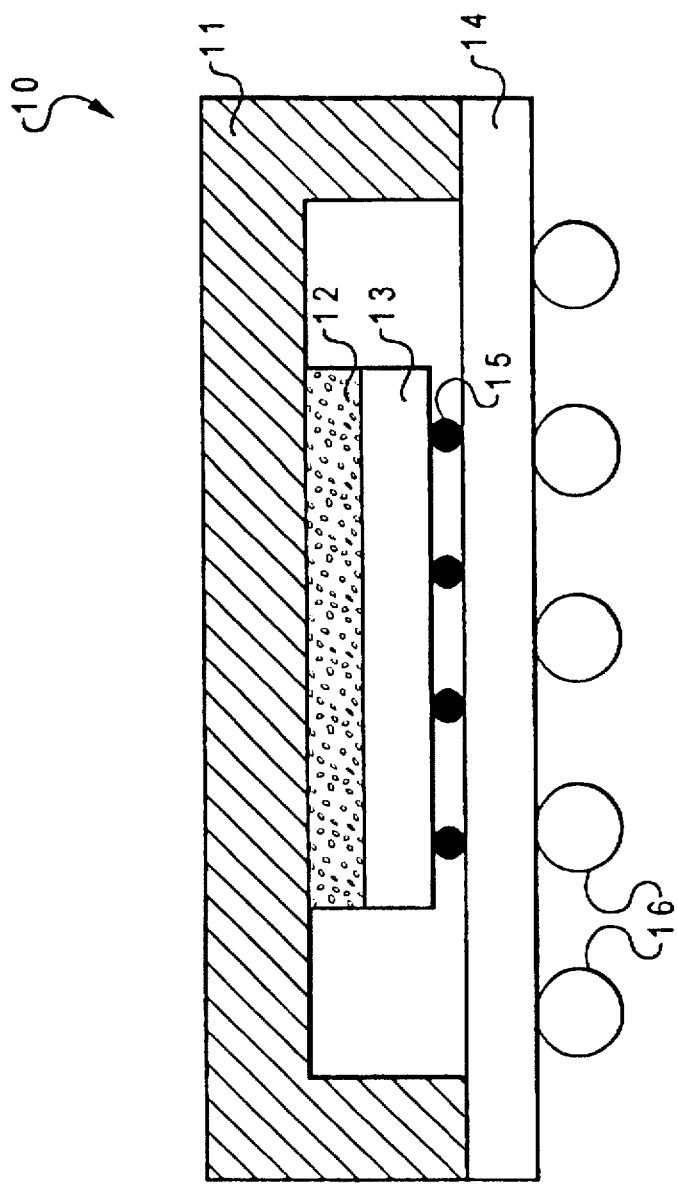
FIG. 1 is a cross-sectional view of a package structure for integrated-circuit chips under the prior art.

Referring now to the drawings and in particular to FIG. 1, there is shown a cross-sectional view of a package structure for IC chips under the prior art. As shown, package structure 10 includes a metal cap 11, an integrated-circuit chip 13, and a ceramic substrate 14. Integrated-circuit chip 13 is electrically and mechanically connected to a ceramic wiring substrate 14 by a multiple of $Pb_{95}Sn_5$ solder bumps 15. Typically, solder bumps 15 have a diameter of approximately 100 µm to 200 µm. Underneath ceramic substrate 14 are a multiple of solder ball connections (SBC) 16. A jelly-like thermal paste layer 12 is utilized to fill the gap between integrated-circuit chip 13 and metal cap 11. Metal cap 11 is acting as a heat sink in this case for integrated-circuit chip 13. Package structure 10 is commonly known in the industry as a flip-chip type package structure.

Under this arrangement, most of the heat generated by integrated-circuit chip 13 is expected to be transferred to metal cap 11. First, the heat flows from the front side of integrated-circuit chip 13 (circuit area) to the back side of integrated-circuit chip 13. Then, the heat flows from the back side of integrated-circuit chip 13 to the back side of metal cap 11 through thermal paste layer 12. Finally, heat flows from the back side of metal cap 11 to the front side of metal cap 11. The total thermal resistance of package structure 10 is the sum of these three heat flows, and is generally referred to as the internal thermal resistance of package structure 10. Among these three heat flows, the thermal resistance associated with the heat flow through thermal paste layer 12 is the dominating thermal resistance. This thermal resistance is directly related to the conductivity of thermal paste layer 12 and to certain areas of integrated-circuit chip 13 where power is highly concentrated. As the technology trend continues to be striving for higher chip density, the power of the chip will also continue to be more intense, and yet the conductivity of thermal paste layer 12 remains relatively constant. Therefore, the substantially high internal thermal resistance associated with the flip-chip-type package structure under the prior art becomes a road block for the cooling of the future high-density, high-power integrated-circuit chips.

Figure 2:
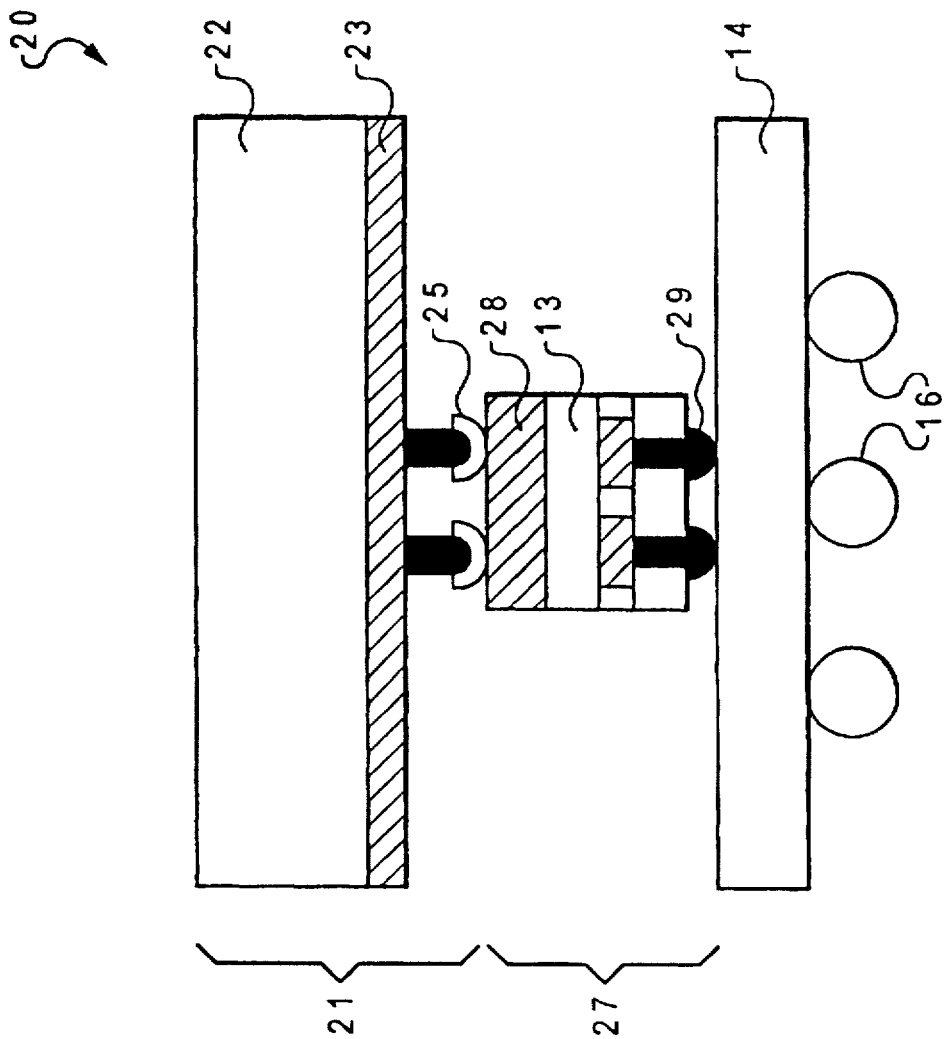
FIG. 2 is a cross-sectional view of a package structure for integrated-circuit chips in accordance with a preferred embodiment of the present invention.

With reference now to FIG. 2, there is illustrated a cross-sectional view of a package structure for integrated-circuit chips in accordance with a preferred embodiment of the present invention. As shown, package structure 20 includes a heat spreader 21, an integrated-circuit chip 27, and a ceramic substrate 14. Heat spreader 21 includes a silicon layer 22; an adhesion-promotion layer 23, such as Cr—Cu—Au; and a multiple of plated solder joints 25. Integrated-circuit chip 27 includes an adhesion-promotion layer 28, such as Cr—Cu—Au, on the back side; a chip 13; and a multiple of solder joints 29 connected to the front side. Ceramic substrate 14 and SBC 16 are the same as those depicted in FIG. 1.

The corresponding cooling paths for package structure 20 are as follows. First, the heat flows from the front side of integrated-circuit chip 27 to the back side of integrated-circuit chip 27. Then, the heat flows from the back side of integrated-circuit chip 27 to the back side of heat spreader 21 through solder joints 25. Finally, heat flows from the back side of heat spreader 21 to the front side of heat spreader 21. Silicon is a preferred material for heat spreader 21 because of its relatively high thermal conductivity (1.6 W/cm/°C.) and its thermal expansion compatibility with integrated-circuit chip 27. The thermal expansion compatibility allows solder joints 25 to be utilized for joining integrated-circuit chip 27 and heat spreader 21 together.

Solder joints 25 also contribute to the heat flow under the present invention. The thermal resistance of solder joints 25 is significantly less than the thermal resistance of thermal paste layer 12 as depicted in FIG. 1. Because the thermal resistance associated with the heat flow through solder joint 25 is also the dominating component of the total internal thermal resistance, the overall internal thermal resistance of package structure 20 is significantly better than that of package structure 10 in FIG. 1.

Figure 3:
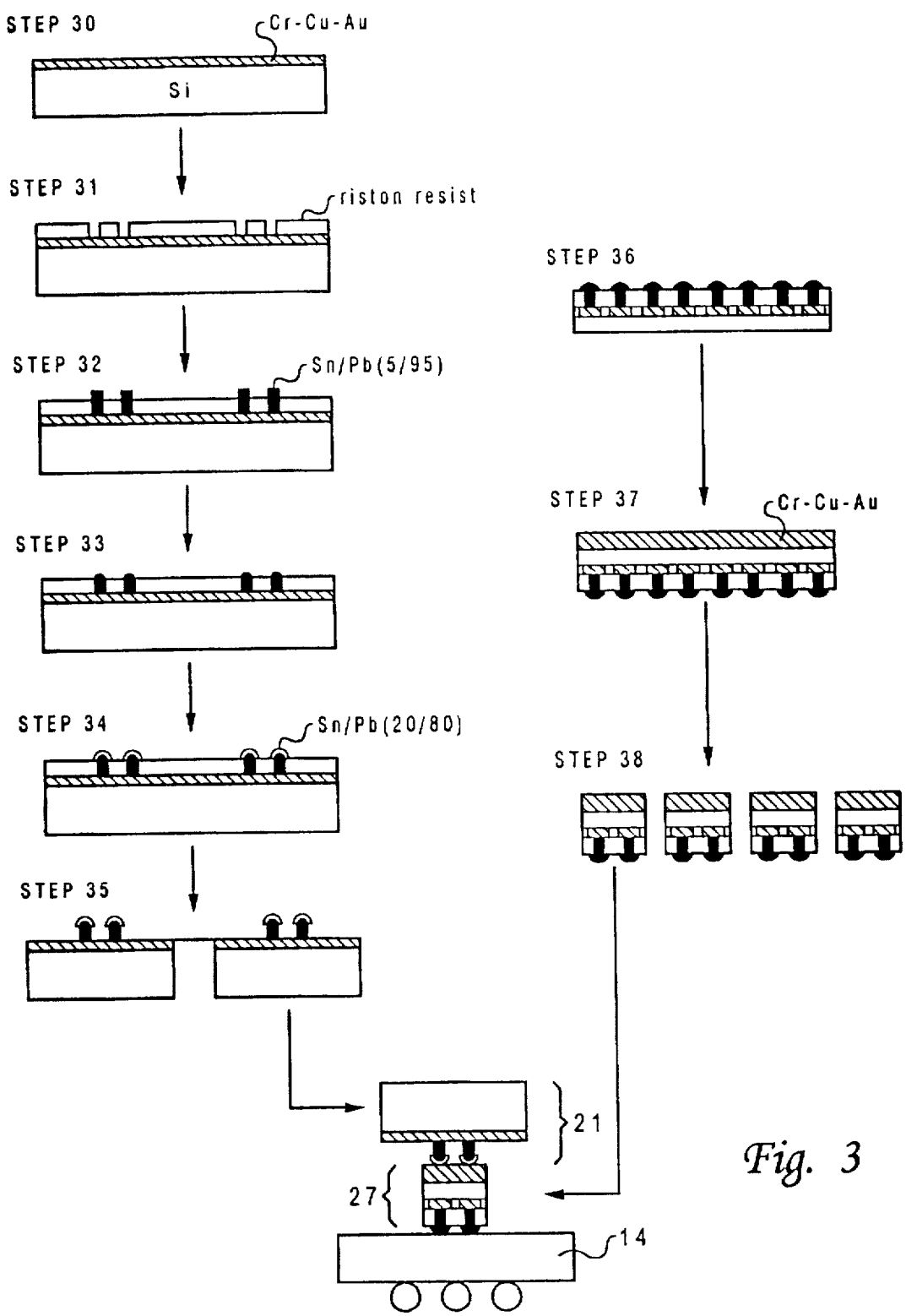
FIG. 3 is a high-level process-flow diagram depicting the steps of heat spreader fabrication and integrated-circuit chip preparation, in accordance with a preferred embodiment of the present invention.

Referring now to FIG. 3, there is illustrated a high-level process-flow diagram depicting the steps for fabricating heat spreader and preparing an integrated-circuit chip, in accordance with a preferred embodiment of the present invention. The steps for fabricating heat spreader 21 are as follows. In step 30, a blanket of adhesion-promotion layer, such as Cr—Cu—Au, is deposited on top of a polished silicon wafer. In step 31, a thick-film resist, such as riston, is applied on top of the Cr—Cu—Au layer at desired locations via a mask. In step 32, a multiple of 5/95 Sn/Pb joints are plated to the designated areas. In step 33, a heat reflow is applied to the silicon wafer to soften the edges of the Sn/Pb joints. In step 34, a 20/80 Sn/Pb solder joint is added to each of the 5/95 Sn/Pb joints. In step 35, the thick-film resist layer is removed from the silicon wafer, and the silicon wafer is sliced into its appropriate size to be utilized as a heat spreader 21.

The steps for preparing integrated-circuit chip 27 are as follows. Initially, in step 36, a heat reflow is applied to a wafer having multiple integrated-circuit chips. In step 37, a blanket of adhesion-promotion layer, such as Cr—Cu—Au, is deposited to the back side of the wafer. Finally, in step 38, the wafer is diced into multiple integrated-circuit chips, and each integrated-circuit chip 27 is ready for its intended applications. During the package assembly, integrated-circuit chip 27 is first joined to ceramic substrate 14 by a heat reflow, and heat spreader 21 is subsequently joined to integrated-circuit chip 27 by another heat reflow.

Figure 4:
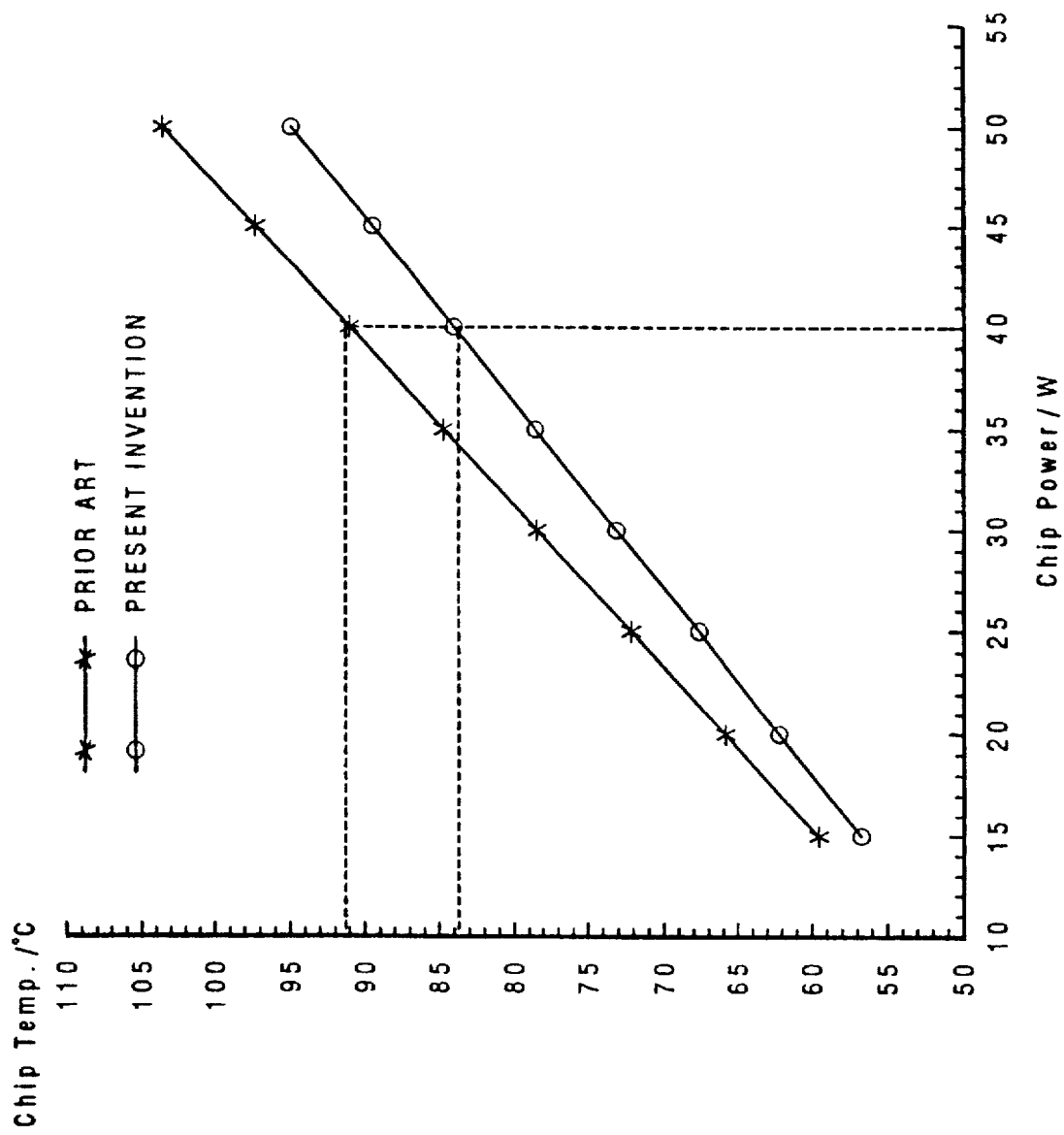
FIG. 4 is a graph depicting two modeling results of maximum chip temperature versus chip power.

With reference now to FIG. 4, there is shown a graph depicting the modeling results of the maximum chip temperatures versus chip power. Internal thermal resistance of the prior-art package structure having the best-available thermal grease bonding layer, and internal thermal resistance of the package structure under the present invention is calculated by thermal modellings. Three modeling assumptions are made for performing the above-mentioned calculations: first, the major mode of heat flow within the package structure is conduction; second, there is uniform convection outside the package structure (h=0.00152 W/cm$^2$/K); and third, the air temperature rise is 1.8° C./W with an airflow of one cubic foot per minute. In addition, both package structures are under the same external cooling conditions.

The modeling results as shown in FIG. 4 indicate that the maximum chip temperature of the package structure under the present invention is 83.9° C. while the maximum chip temperature of the package structure under the prior art is 91.2° C. Accordingly, the internal thermal resistance for the package structure under the present invention is 0.32° C./W, while the internal thermal resistance for the package structure under the prior art is 0.56° C./W.

As has been described, the present invention provides a package structure having an efficient heat-dissipating heat spreader for integrated-circuit chips. The invention is a novel capless ceramic ball grid array single chip module with a silicon heat spreader. Under the present invention, the internal thermal resistance is improved by eliminating the low thermal conductivity thermal compound utilized under the prior art.

While the invention has been particularly shown and described with reference to a preferred embodiment, it will be understood by those skilled in the art that various changes in form and detail may be made therein without departing from the spirit and scope of the invention.

What is claimed is:

1. A packaged integrated-circuit chip comprising:
   a wiring substrate;
   an integrated-circuit chip having a first surface and a second surface, wherein said first surface is electrically and mechanically connected to said wiring substrate via a first set of solder joints; and
   a heat spreader connected to said second surface of said integrated-circuit chip via a second set of solder joints, wherein said heat spreader includes an adhesion-promotion layer on a silicon layer, such that heat generated from said integrated-circuit chip can be efficiently transmitted to and subsequently dissipated by said heat spreader.

2. The packaged integrated-circuit chip according to claim 1, wherein said wiring substrate is ceramic.

3. The packaged integrated-circuit chip according to claim 1, wherein said adhesion-promotion layer is Cr—Cu—Au.

4. The packaged integrated-circuit chip according to claim 1, wherein said integrated-circuit chip further includes a second adhesion-promotion layer on said second surface of said integrated-circuit chip.

5. The packaged integrated-circuit chip according to claim 4, wherein said second adhesion-promotion layer is Cr—Cu—Au.

* * * * *